(12) United States Patent
Wittmer et al.

(10) Patent No.: US 7,524,423 B2
(45) Date of Patent: Apr. 28, 2009

(54) SYSTEM AND METHOD OF GENERATING A RINGING MAGNETIC PULSE FOR THE TREATMENT OF FLOWING LIQUIDS

(75) Inventors: Kenneth E. Wittmer, Newtown, CT (US); Walter F. J. Crewson, Ridgefield, CT (US)

(73) Assignee: Clearwater Systems Corporation, Essex, CT (US)

( * ) Notice: Subject to any disclaimer, the term of this patent is extended or adjusted under 35 U.S.C. 154(b) by 651 days.

(21) Appl. No.: 11/192,452

(22) Filed: Jul. 27, 2005

(65) Prior Publication Data
US 2006/0124557 A1 Jun. 15, 2006

Related U.S. Application Data

(60) Provisional application No. 60/634,959, filed on Dec. 10, 2004.

(51) Int. Cl.
*B01D 17/12* (2006.01)
*C02F 1/48* (2006.01)

(52) U.S. Cl. .............. 210/748; 210/143; 210/222; 210/243; 204/554; 204/555; 204/660; 204/661

(58) Field of Classification Search .............. 210/143, 210/222, 243, 748; 204/554, 555, 660, 661
See application file for complete search history.

(56) References Cited

U.S. PATENT DOCUMENTS 5,106,491 A    4/1992  Schulze

| 5,702,600 | A | * | 12/1997 | Pandolfo ................ 210/222 |
| 5,738,766 | A | | 4/1998 | Jefferson |
| 6,063,267 | A | | 5/2000 | Crewson |
| 6,641,739 | B2 | | 11/2003 | Dresty, Jr. et al. |
| 6,706,170 | B1 | | 3/2004 | De Baat Doelman |

OTHER PUBLICATIONS

Clearwater Systems LLC website, "Chemical-Free Treatment of Recirculating Water Using Pulsed-Power", undated.
Goldsworthy et al., "Biological Effects of Physically Conditioned Water", Biology Dept., Imperial College of Science Technology and Medicine, vol. 33, No. 7,pp. 1618-1626, 1999.

(Continued)

*Primary Examiner*—David A Reifsnyder
(74) *Attorney, Agent, or Firm*—Michaud-Duffy Group LLP

(57) ABSTRACT

A method and system of generating a ringing magnetic pulse for the treatment of flowing liquids include's a coil and an SCR coupled in series with the coil to form a first loop. An electronic switch is coupled in series with the coil to form a second loop. An AC voltage signal is applied to the coil having first and second half-cycles. Current is conducted through the first loop during the first half-cycle when the SCR is forward biased while preventing current from conducting through the second loop. Current is conducted through the second loop during a portion of the second half-cycle while current is prevented from conducting through the first loop. Current is interrupted through the second loop during another portion of the second half-cycle upon the coil current reaching a predetermined value to interrupt current flowing through the coil, thereby generating a ringing magnetic pulse.

27 Claims, 3 Drawing Sheets

OTHER PUBLICATIONS

Baker et al., "Magnetic Amelioration of Scale Formation", School of Water Sciences, Cranfield University, vol. 30, No. 2, pp. 247-260, 1996.

Donaldson et al., "Lifting the Scales from our Pipes", New Scientist 18, Feb. 1988.

Lane, John et al., "Condenser Water Treatment Using Pulsed Power," 2003 Cooling Technology Institute Annual Conference, San Antonio, TX.

International Search Report for PCT/US2005/043282 dated Jul. 21, 2006.

* cited by examiner

SYSTEM AND METHOD OF GENERATING A RINGING MAGNETIC PULSE FOR THE TREATMENT OF FLOWING LIQUIDS

CROSS-REFERENCE TO RELATED APPLICATION

This application is entitled to the benefit of and incorporates by reference essential subject matter disclosed in Provisional Patent Applications No. 60/634,959 filed on Dec. 10, 2004.

FIELD OF THE INVENTION

This invention relates generally to the treatment of flowing water or other liquids, and more particularly to the treatment of such liquids with a ringing magnetic pulse.

BACKGROUND OF THE INVENTION

In the past, various different devices and methods have been proposed for treating liquid with electromagnetic flux for the purpose of reducing the scaling propensity of the liquid, for reducing the number of living microorganisms contained in the liquid or for other purposes. For example, an apparatus for treating flowing liquid with electromagnetic flux is disclosed in U.S. Pat. No. 6,063,267 assigned to Clearwater Systems, LLC, the disclosure of which is herein incorporated by reference.

Some of these prior devices have used either stationary or movable permanent magnets for producing a magnetic flux, and others have used electrical coils arranged in various different ways with respect to pipes conducting the liquid, with the coils being energized by either a direct current power source or an alternating current power source to create an electromagnetic flux used as the liquid treatment factor. In the case of devices using electromagnetic flux, it is known from U.S. Pat. No. 5,702,600 to provide an apparatus including a plurality of electrical coils surrounding different separate longitudinal sections of a liquid conducting pipe, with two of the coils being wound on top of one another, a diode being so connected in circuit with the coils and with the power source that current from the power source is conducted through the coils only during alternate half-cycles of one voltage polarity, with some current of a ringing nature apparently flowing through each coil following the end of each half-cycle of diode conduction. However, the ringing current, and the electromagnetic flux produced appears to be weak and of very short duration so as to be of small effectiveness.

Prior systems for treating flowing liquids with a ringing magnetic pulse used a diode switch to interrupt the coil current when the current reversed polarity. For example, a prior analog control system produced a relatively small "ringing" pulse on the coil voltage when the current was blocked by the diode because there was still voltage remaining on the coil capacitance. The analog control system was modified to generate a much larger "ringing" voltage of up to ten times that of the above-mentioned previous analog control system. This design used in place of the diode, a switch comprising up to ten parallel-connected 450 volt MOSFETs. This switch interrupted the current flow before the coil current reached zero, leaving stored magnetic energy in the coil which powered the larger "ringing" pulse. With this approach, a switch is needed that can be electronically "turned off", and such switches tend to be low current devices with relatively high "011 state" resistance. As a result, ten switches in parallel are needed to handle the full coil current.

Digital control systems have been developed in order to improve stability of operation relative to that of the above-mentioned prior analog control systems. However, there is still a need to lower the complexity and cost of such digital control systems.

Accordingly, it is a general object of the present invention to provide a system and method of treating liquid with a ringing magnetic pulse which overcomes the above-mentioned drawbacks and disadvantages of prior systems and methods of treating liquids.

SUMMARY OF THE INVENTION

The present invention resides in a method of generating a ringing magnetic pulse for the treatment of flowing liquids. An inductive coil and a silicon controlled rectifier (SCR) coupled in series with the coil are provided to form a first electrical loop. An electronically controlled switch, such as a MOSFET, is coupled in series with the coil to form a second electrical loop. The switch is preferably electrically connected generally in parallel with the SCR. An AC voltage signal is applied to the coil. The AC voltage signal has a period including a first half-cycle and a second half-cycle of opposite polarity to that of the first half-cycle. Current is conducted through the first loop during at least a portion of the first half-cycle when the SCR is forward biased while preventing current from being conducted through the second loop. Current is conducted through the second loop during a first portion of the second half-cycle while current is prevented from being conducted through the first loop when the SCR is reverse biased. Current is prevented from flowing through the second loop during a second portion of the second half-cycle upon the current flowing through the coil reaching a predetermined value to interrupt current flowing through the coil and to thereby generate a ringing magnetic pulse.

The present invention also resides in a system for generating a ringing magnetic pulse. The system includes an inductive coil to be powered by an AC voltage signal having a period including a first half-cycle and a second half-cycle of opposite polarity to that of the first half-cycle. A silicon controlled rectifier (SCR) is coupled in series with the coil to form a first electrical loop. An electronically controlled switch is coupled in series with the coil to form a second electrical loop. The switch is electrically connected generally in parallel with the SCR. The system further includes means for conducting current through the first loop during at least a portion of the first half-cycle when the SCR is forward biased while preventing current from being conducted through the second loop. Means are provided for conducting current through the second loop during a first portion of the second half-cycle while current is prevented from being conducted through the first loop when the SCR is reverse biased. The system further includes means for preventing current from flowing through the second loop during a second portion of the second half-cycle upon the current flowing through the coil reaching a predetermined value to interrupt current flowing through the coil and to thereby generate a ringing magnetic pulse.

The invention also resides in other details of method of operation and construction of the system as set forth in the appended claims, and these details will be apparent from the

DETAILED DESCRIPTION OF THE PREFERRED EMBODIMENT

Figure 1:
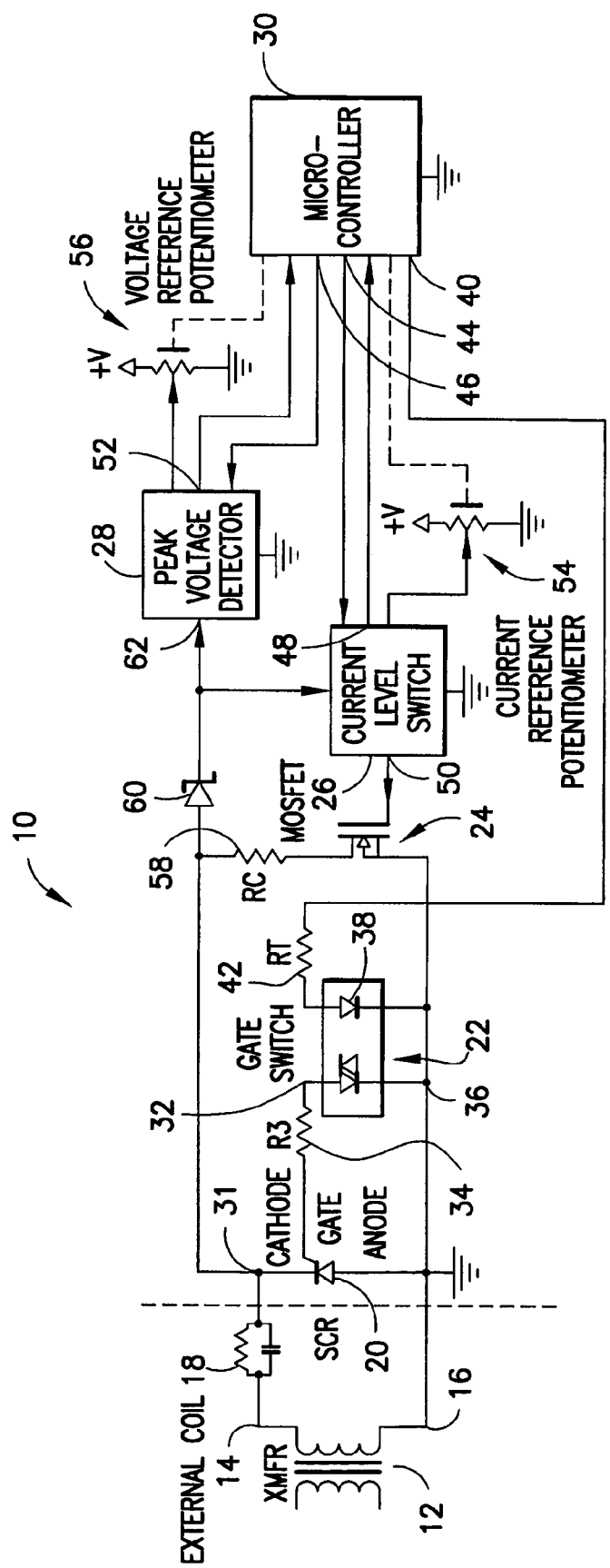
FIG. 1 is a schematic circuit diagram of a system for generating a ringing magnetic pulse for treating flowing liquid in accordance with the invention.

With reference to the FIGURE, a system for generating a ringing magnetic pulse for treating flowing liquids in accordance with the present invention is indicated generally by the reference number 10. The system 10 comprises an input power transformer 12 having first and second output terminals 14, 16, a coil IS, an SCR 20, a triac 22, a MOSFET 24 serving as an electronically controlled switch, a current level switch 26, a peak voltage detector 28, and a programmable digital microcontroller 30.

It has been discovered that digital control systems for generating a ringing magnetic pulse can be modified in order to be of simpler construction and less expensive by substituting a single silicon controlled rectifier (SCR) switch for a MOSFET switch assembly. SCRs are available with higher current ratings and lower losses relative to MOSFETs, and a single device can easily handle the coil current. However, SCRs cannot be electronically turned off as a MOSFET can, so that the high voltage "ringing" pulse has to be produced some other way than by interrupting the coil current pulse, as will be explained more fully below.

Referring again to the FIGURE, the coil 18, having an inductance and a capacitance connected in parallel, has a first end coupled to the first terminal 14 of the transformer 12. The illustrated capacitance can be and is herein taken to be comprised solely of the capacitance of the coil, but in some coils the stray capacitance may be supplemented by a discrete capacitor converted in parallel with the coil. The SCR 20 has a cathode coupled to a second end 31 of the coil 18, and an anode coupled to the second output terminal 16 of the transformer 12. As shown, the anode of the SCR 20 is coupled to electrical ground. The triac 22 serves as an SCR gate switch. As shown in the FIGURE, the triac 22 is an optically-coupled triac having a first terminal 32 coupled to the gate of the SCR 20 via a gate resistor 34, and a second terminal 36 coupled to ground potential. The triac 22 further includes a light emitting diode (LED) 38 that when energized to emit light closes the gate switch to enable current flow between the first and second terminals 32, 36 of the triac 22.

The microcontroller 30 includes a first output 40 coupled to an anode of the LED 38 via a resistor 42, a second output 44 coupled to the current level switch 26, and a third output 46 coupled to the peak voltage detector 28. The current level switch 26 includes a first output 48 coupled to the microcontroller 30, and a second output 50 coupled to the gate of the MOSFET 24. The peak voltage detector 28 includes an output 52 coupled to the microcontroller 30. A digitally controlled current reference potentiometer 54 is coupled to an input of the current level switch 26, and is adjustable by the microcontroller 30. A digitally controlled voltage reference potentiometer 56 is coupled to the peak voltage detector 28, and is adjustable by the microcontroller 30.

The MOSFET 24, such as the illustrated n-channel IGFET with substrate tied to source, includes a source coupled to ground potential, and a drain coupled to the second end 31 of the coil 18 via a current sense resistor 58. A high voltage Schottky diode 60 has an anode coupled to the second end 31 of the coil 18 and a cathode coupled to an input 62 of the peak voltage detector 28.

The system 10 is generally preferably mounted on a printed circuit board (not shown). However, two components are preferably external to the printed circuit board (PCB), namely, the coil 18 and the power transformer 12. The transformer 12 provides a 50-60 Hz AC voltage to power the coil 18. The main power component on the PCB is the SCR 20 which is preferably heat-sinked and which functions as a controllable diode. When an ordinary diode is forward-biased (anode voltage positive with respect to the cathode) it conducts current. When an SCR is forward-biased it will not conduct current unless the gate (control) lead is also forward-biased. Both an SCR and an ordinary diode will block current if they are reverse-biased.

When the SCR gate lead is connected to its anode (via a resistor), the SCR will conduct current when the SCR anode is positive with respect to its cathode. This occurs during the negative voltage half-cycle (as referenced to the SCR anode which is considered to be circuit ground in the FIGURE). Since the coil 18 is predominantly inductive (with some small internal resistance) at 60 Hz, negative current will continue to flow for a large portion of the positive voltage half-cycle. When the current drops to zero, the SCR 20 will block positive current flow (from cathode to anode) as does a diode rectifier. When the SCR 20 turns off, the voltage across the SCR will jump to a positive level during the remainder of the positive voltage half-cycle. It is during this positive voltage period that the microcontroller 30 generates resonating current and voltage pulses within the coil 18.

A ringing voltage pulse across the coil 18 is created by first closing the MOSFET solid-state switch 24 for a brief period at any time during the positive voltage cycle when the SCR 20 is off. The MOSFET 24 is closed, or made to conduct, by applying a positive voltage to its control electrode or gate via the current level switch 26. Positive current will build up in the coil 18 while the MOSFET 24 is closed (the rise time is determined by the value of the current sense resistor 58 and the inductance of the coil 18). When the current level reaches a designated trigger value, the MOSFET switch 24 is abruptly opened by the current level switch 26 (the current level switch removes the positive voltage from the gate of the MOSFET 24, which causes the MOSFET to become non-conducting). The inductance and capacitance values of the coil 18 will determine the frequency of the resulting resonating current flow within the coil and the magnitude of the ringing voltage as viewed across the SCR 20. The decay time of the ring is determined by the internal resistance of the coil 18. Multiple ringing pulses can be generated during the positive voltage period (the number of which is primarily limited by the decay time of the coil resonance).

The gate resistor 34 of the SCR 20 must be disconnected from the anode of the SCR during the positive voltage period to prevent the SCR from turning on when ringing pulses are generated—which would quickly terminate the ring. Multiple methods of switching the gate resistor 34 were tried (such as a MOSFET and a transistor, directly and optically coupled) all of which presented operational and performance problems. The best method for switching the gate resistor 34 was determined to be an optically-coupled triac (as shown in the FIGURE). The triac 22 need only be energized prior to the start of the negative voltage half-cycle. Once current starts to flow in the SCR 20, the triac 22 can be de-energized. The SCR 20 will continue to conduct until current drops to zero and the cathode-to-anode voltage across the SCR is positive. Interestingly, a small ringing pulse in the coil 18 occurs when the SCR 20 switches off which is caused by the charge stored in the coil capacitance.

The operation of the system 10 is primarily implemented using the programmable digital microcontroller 30 coupled to and aided by the peak voltage detector 28 and the current level switch 26. The microcontroller 30 does not directly interface with the coil 18, the SCR 20 and the MOSFET 24—nor does the microcontroller directly view the coil voltage level. The coil voltage is presented to the current level switch 26 and the peak voltage detector 28 through the high voltage Schottky diode 60. The current level switch 26 and the peak voltage detector 28 compare the incoming voltage level to a reference voltage level set by the digitally controlled potentiometers 54, 56, respectively to determine its action.

The primary function of the peak voltage detector 28 is to compare the level of the coil ringing voltage signal to the reference level set by the digital potentiometer 56 associated with the peak voltage detector. If the peak level exceeds the given reference level, the peak voltage detector 28 will store that event so that it can be later read by the microcontroller 30. The stored event is cleared after it is read by the microcontroller 30. The peak voltage detector 28 is used to determine that the peak voltage exceeds the minimum desired value and also that it does not exceed a maximum value. A secondary function of the peak voltage detector 28 is to determine the value of the transformer voltage on start-up. The microcontroller 30 needs to know the transformer voltage because the ring signal rides on top of the transformer voltage. The transformer voltage reading is added to the desired ring voltage level when the reference voltage is set.

The current level switch 26 controls the MOSFET 24 used to generate the coil ringing pulse. The microcontroller 30 sends a trigger pulse to the current level switch 26 to initiate a ring. When triggered, the current level switch 26 raises the voltage on the gate lead of the MOSFET 24, thereby turning it on. The "on" resistance of the MOSFET 24 is much less than the value of the current sense resistor 58. The MOSFET 24 is held "on" until the voltage at the current sense resistor 58—coil junction (the cathode of the SCR 20) exceeds the reference voltage set by the current reference potentiometer 54 associated with the current level switch 26. The value of the resistor 58 and the reference voltage is not as important as ensuring that the current value at which the MOSFET 24 turns off is repeatable for a given potentiometer setting. The role of the microcontroller 30 is to adjust the potentiometer 54 of the current level switch 26 to achieve the desired voltage level for the coil "ring".

The overall operation of the microcontroller 30 is executed in software embedded within the microcontroller. The functions of that software program are now described. When the system 10 is first powered-up, the SCR 20 and the MOSFET 24 are both off (i.e. no current flows through the coil 18). The first task of the microcontroller 30 is to test for the presence of coil power voltage from the transformer 12. This can be accomplished by setting the peak voltage detector 28 at a low level and monitoring the output. An alternative method is to monitor a tap provided in the current level switch 26 which reads zero when the coil voltage is negative and rises to +5V when the coil voltage goes positive. The microcontroller 30 waits until it observes two alternating 50-60 Hz power line voltage cycles before proceeding. When the AC coil voltage is detected, the microcontroller 30 will measure its peak level by monitoring the output of the peak voltage detector 28 while it raises the level of the voltage reference potentiometer 56. The peak level reading is retained in the microcontroller 30 and used as an offset for adjusting the level of the generated ring pulses which ride on the coil power voltage.

The next software task is to turn on the SCR 20 which is a periodic task occurring once per voltage cycle. Just before the end of the positive voltage period (the SCR anode-to-cathode voltage is negative during this "positive" period, as the SCR anode is used as the ground-reference), the SCR gate switch or triac 22 is turned on by powering its optically coupled LED 38. When the negative voltage across the SCR 20 is approximately 2 volts, the SCR will begin to conduct current at which time power to the gate switch LED 38 is removed. The SCR 20 will remain latched on without the gate switch 22 being powered, until the SCR 20 current flow drops to zero.

The ringing pulses are produced by a second periodic software task. This task waits until the SCR 20 turns off and a positive coil voltage is detected (which is a sharp jump nearly the height of the peak coil voltage). The task waits a few milliseconds to allow the small coil ring (which occurs when the SCR 20 turns off) to die out. To generate a high voltage ringing pulse the software sends a trigger signal to the current level switch 26, which turns on the MOSFET 24, allowing positive current flow to rise in the coil 18. The task monitors the current level switch 26, waiting for the current level switch to signal that the current level has risen to the trigger point and the MOSFET 24 has turned off. The task waits for a few milliseconds to ensure that the coil ring has died out before proceeding. As many as six ring pulses can be generated within the positive coil voltage period.

During the negative voltage period, the microcontroller 30 determines if the peak voltage detector 28 has been triggered, which indicates that ringing signal exceeded the reference level set in the voltage reference potentiometer 56. The voltage reference potentiometer 56 can be set to either the minimum or the maximum desired peak voltage level. If the voltage reference potentiometer 56 is set for the minimum peak voltage, and the peak voltage detector 28 has not been triggered, the microcontroller 30 will increase the level of the current reference potentiometer 54 and leave the voltage reference potentiometer 56 at the minimum level. If the voltage reference potentiometer 56 is set for the minimum peak voltage, and the peak voltage detector 28 has been triggered, the microcontroller 30 will hold the level of the current reference potentiometer 54 and change the voltage reference potentiometer 56 to the maximum level. If the voltage reference potentiometer 56 is set to the maximum level, and the peak voltage detector 28 has been triggered, the microcontroller 30 will decrease the level of the current reference potentiometer 54 and leave the voltage reference potentiometer 56 at the maximum level. If the voltage reference potentiometer 56 is set to the maximum level, and the peak voltage detector 28 has not been triggered, the microcontroller 30 will hold the level of the current reference potentiometer 54 and change the voltage reference potentiometer 56 to the minimum level. The preceding actions will move and hold the peak voltage level for the ring pulse between the minimum and maximum desired values. The above logic pattern serves as a digital voltage regulator for the ringing voltage pulse.

Also during the negative voltage period, the microcontroller 30 reads the resistance value of a negative temperature coefficient (NTC) thermistor (not shown) affixed to the heat sink of the SCR 20. If the resistance drops below the value equated to the maximum temperature designated for the SCR heat sink (which is lower than destruction level for the SCR 20) the microcontroller 30 will turn off the SCR and also cease generating ringing pulses. The microcontroller 30 will continue to periodically read the thermistor and when it is determined that the SCR temperature has dropped to a safe level, the microcontroller will automatically resume operation.

On the bottom of the printed circuit board can be two status LEDs (not shown)—preferably one red and one green—viewable through holes in a controller cover. The green LED is lit when the microcontroller 30 has determined that the voltage level of the ringing pulses is within the desired range, otherwise the red LED is lit. A single-pole double-throw relay contact (not shown) is preferably provided for remotely monitoring the status—when the green LED is lit the relay is energized.

The functioning of the above-described SCR-switched circuit is as follows:

The SCR (Silicon Controlled Rectifier) acts like a diode with a controllable turn-on capability. When voltage is applied in the "forward direction" (forward-biased-anode positive with respect to cathode) a diode will conduct current. However, the SCR will NOT conduct when forward-biased unless a current is made to flow in its "gate" circuit. If no gate current is applied, the SCR will "block" the flow of current even when forward-biased. Both the SCR and the diode will block the flow of current when the direction of current flow reverses (cathode to anode is the reverse-current direction). The SCR cannot be turned off by removing its gate current after it has been turned on. It can only be turned off by reversing the direction of current flow. In this it acts the same as a silicon diode (rectifier). Hence its name, "silicon controlled rectifier".

The coil, transformer and SCR switch are all connected in series. When the time-varying (50 or 60 cycles per second) transformer voltage applies a forward bias to the SCR, gate current is applied and the SCR conducts current through the coil. The SCR has a very low voltage drop from anode to cathode when conducting (less than or equal to one volt typically) so it acts like an almost-perfect switch. On the circuit boards of prior devices MOSFETs (Metal-Oxide-Silicon Field Effect Transistors) are used as the switch, and these MOSFETs have a larger "forward" voltage drop than does an SCR and so dissipate more heat than the SCR. For this reason, in the prior devices ten parallel-connected MOSFETs are used to carry the coil current, where a single SCR will do the same job in devices according to the present invention with lower overall power loss.

When the coil current attempts to reverse direction, the SCR turns off and allows voltage to rise across it, just as a diode would do. The SCR then blocks current flow when the current reverses. Because the voltage and current across the coil are almost 90 degrees out of phase with each other, the current crosses zero (reverses) when there is still substantial voltage across the coil. This frees the coil to "ring" at a low voltage level due to the energy stored in its stray capacitance.

After this initial small or natural "ringing" pulse has died out, a small current is allowed to build up in the coil by closing a MOSFET switch. This switch does not carry the main coil current, so a small switch can be used for this "recharging" function.

When this current has reached a preset level, the MOSFET is turned off, and the coil voltage "rings" again, this time producing a large ringing pulse at a higher voltage level, depending on the amount of current that is allowed to build up.

The regulator circuit measures the peak value of this "ringing" voltage and compares it to the desired value, which is stored as a number in the microprocessor "chip" on the circuit board. If the voltage is too low, then after the ringing pulse has died away the microprocessor turns the MOSFET on again and holds it "on" for a longer time, allowing more coil current to build up than before. The MOSFET is then turned off, and the large ringing pulse repeats.

If the pulse voltage is too high, the microprocessor reduces the "on time" of the MOSFET switch for the next pulse, causing less coil current to build up. The MOSFET then turns off and the ringing voltage is again measured.

When the ringing voltage has reached the desired level (it falls within a "window" range of voltages stored in the microprocessor), the regulator "remembers" this and fixes the MOSFET "on" time for subsequent pulses at this value unless the pulse voltage drifts outside the "window" again. This can occur if the coil resistance changes as the coil temperature changes during operation. If that occurs, preceding steps are repeated until the voltage is once again within the "window".

All the large "ringing" pulses are generated during the interval when the SCR switch is reverse-biased by the applied circuit voltage from the power transformer. The SCR allows the ringing pulses to occur (its gate current is zero during this interval), even though the ringing pulse voltage will at times cause the SCR voltage to switch over to the "forward" bias condition. The SCR will not turn on when this occurs, unlike a diode, as its gate current is held to zero by the gate driver switch. A diode switch could not be used as it would conduct and destroy the "ringing" pulses.

Several large ringing pulses can be inserted in this reverse-bias time interval. If more voltage is desired, the "voltage window" numbers stored in the microprocessor are increased. The regulator then operates as above to force the voltage upward. More time is then required to "charge" the coil with current so fewer pulses can be generated in the interval; and vice versa.

Other techniques can be used to generate ringing pulses similar to those described above. The preferred technique, as described above, uses the coil's inductance as an energy storage element to generate the ringing voltage, so it is a simpler method than others which must store the energy elsewhere. However, any device that stores the required pulse energy can be used to generate a ringing pulse. For example, a capacitor can be charged to 150 volts (or any other desired voltage) and switched across the coil during the "off time" of the coil current. This too will generate a ringing pulse, but it requires a high voltage power supply and an extra capacitor. This method also increases the capacitance in the "ringing" circuit, and causes a lower "ringing" frequency than our method does. The preferred method uses the unavoidable "stray" capacitance of the coil as the resonating capacitance, and generates the highest possible ringing frequency.

Figure 2:
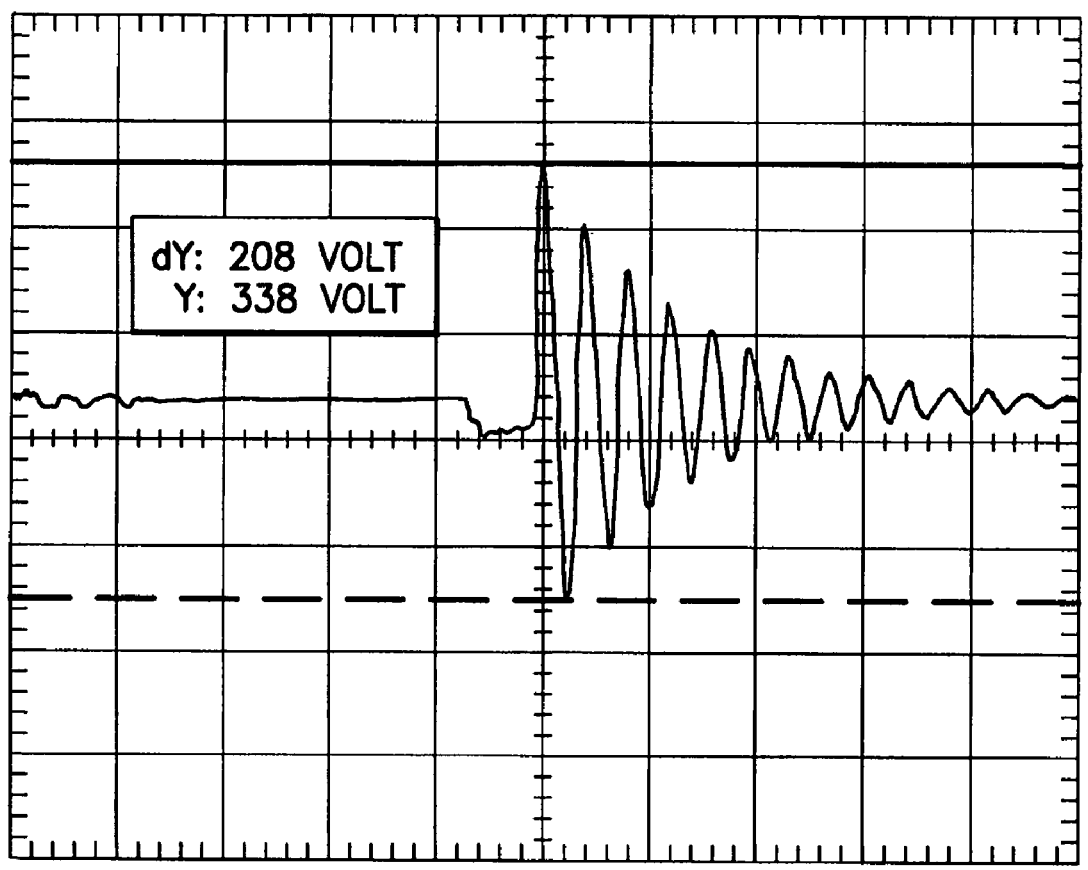
FIG. 2 is an oscilloscope trace showing a single large ringing pulse according to the invention.
Figure 3:
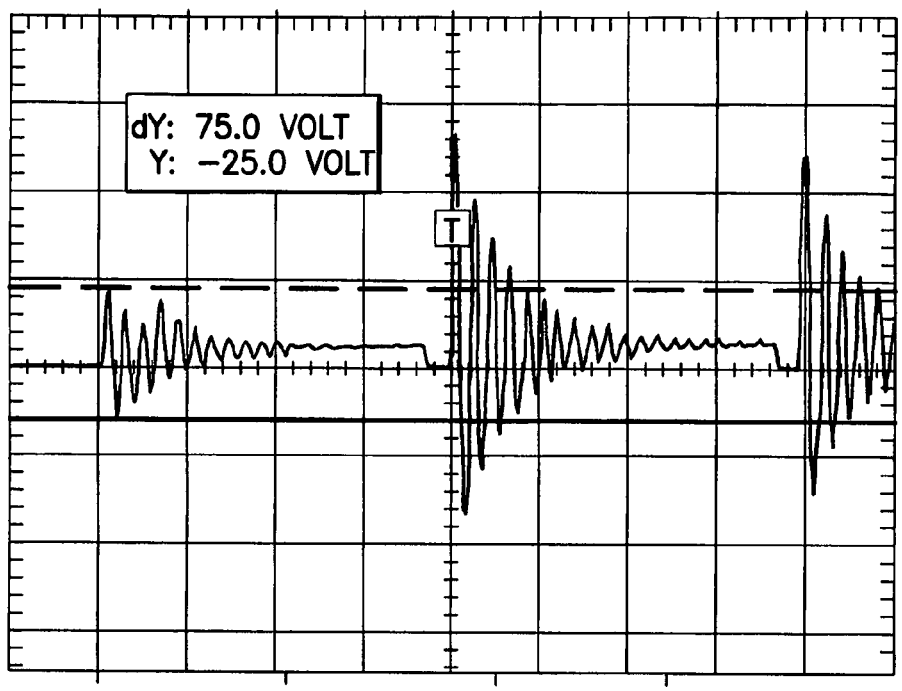
FIG. 3 is an oscilloscope trace showing a "natural" ringing pulse followed by more than one large ringing pulse according to the invention.
Figure 4:
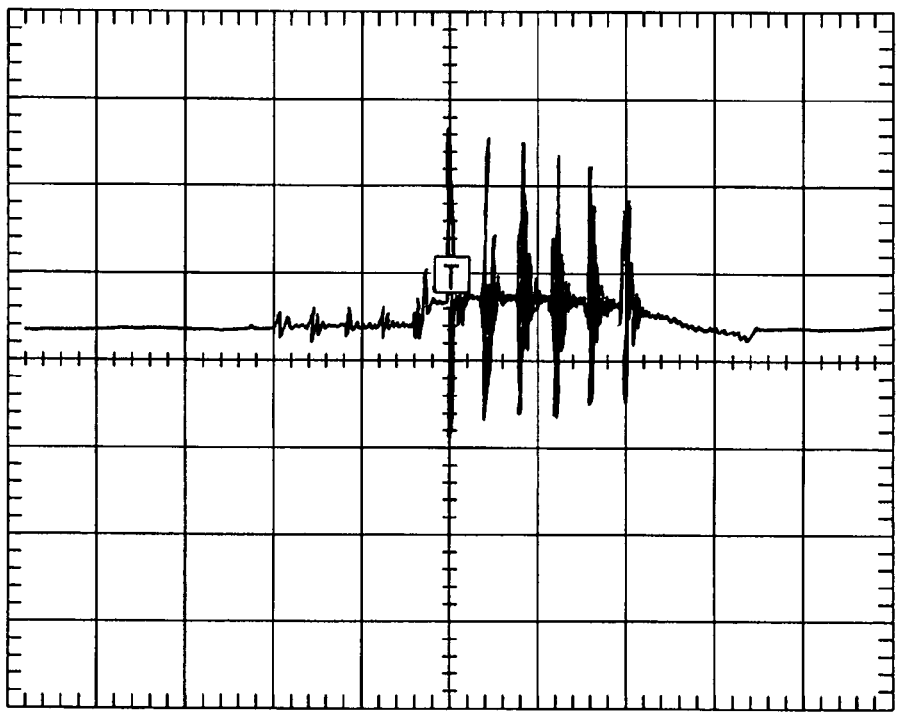
FIG. 4 is an oscilloscope trace showing a series of six full large ringing pulses according to the invention.

A session testing the performance of a device such as shown by FIG. 1 and as described above with a digital scope on a workbench produced the results shown in FIGS. 2, 3 and 4. As can be seen, the inventive control circuit can fit several (in this case six) large ringing pulses into the available "off" time window between transformer current pulses. The number of large ringing pulses is selectable by inputting a number to the control program via the computer programming interface.

FIG. 2 shows a single pulse from the group; the printing at the left indicates the two horizontal cursor lines (white) were 208 volts apart. The sweep speed is 100 µs/division. The voltage scale is 50V/division.

In FIG. 3 is seen the first "natural" ring when the SCR turns off, about 75 volts peak-to-peak. Then come the large rings caused by the control circuit which large ringing pulses are between three and four times larger in voltage than the small "natural" ringing pulse. Note, there is more than one large ringing pulse visible in FIG. 3. The sweep speed here is 200 μs/division and the voltage scale is 50V/division.

Finally, in FIG. 4 we see a full six large ringing pulses. These fit into the approximately 8 millisecond "SCR off" time for this size (one inch) device. With larger coils, this time may be shorter and fewer pulses will fit in. The sweep speed here is 2 ms/division and the voltage scale is 50V/division.

In summary, the system and method embodying the present invention employs an SCR for handling the main coil current and uses a single MOSFET switch to draw a relatively small current through the current coil(s) after the main current pulse has ended. One or more large ringing pulse or pulses is then produced by turning this switch off. Several ringing pulses can be produced in this way during the zero current interval through the coils, and the production of up to six pulses has been achieved.

As will be recognized by those of ordinary skill in the pertinent art, numerous modifications and substitutions may be made to the above-described embodiment of the present invention without departing from the scope of the invention. Accordingly, the preceding portion of this specification is to be taken in an illustrative, as opposed to a limiting sense.

What is claimed is:

1. A method for electromagnetically treating a flow of liquid, said method comprising:
    providing a coil means surrounding said flow and having both an inductance and a capacitance in parallel with one another;
    providing an AC voltage source having a period including a first half cycle of one polarity and a second half cycle of a polarity opposite to that of the first half cycle;
    connecting a first switch in series with the AC voltage source and the coil means;
    controlling the first switch so as to conduct current from the AC voltage source in one direction through the first switch and the coil means during at least a portion of each first half cycle of the AC voltage source and so as to not conduct current through the first switch in a direction opposite to said one direction during each second half-cycle of the AC voltage source; and
    during each second half-cycle of the AC voltage source performing successive substeps of first connecting an electrical energy source to said coil means to add electrical energy to the coil means and then disconnecting said electrical energy source from said coil means to produce a ringing current pulse in said coil means, the successive substeps being performed at least once.

2. A method as defined in claim 1, wherein said first switch is a silicon controlled rectifier (SCR) forming a first electrical loop with the coil means and the AC voltage source.

3. A method as defined in claim 2, and further comprising:
    said step of during each second half-cycle of the AC voltage source performing at least one successive substeps being accomplished by providing an electrically controlled switch connected in series with the coil means and the AC voltage source to form a second electrical loop;
    conducting current through the first loop during at least a portion of the first half-cycle when the SCR is forward biased while preventing current from being conducted through the second loop;
    conducting current through the second loop during a first portion of the second half-cycle while current is prevented from being conducted through the first loop when the SCR is reverse biased; and
    preventing current from flowing through the second loop during a second portion of the second half-cycle upon the current flowing through the coil reaching a predetermined value to interrupt current flowing through the coil and to thereby generate a ringing magnetic pulse.

4. A method as defined in claim 3, wherein the step of providing an electronically controlled switch includes providing the electrically controlled switch so as to be electrically connected generally in parallel with the SCR.

5. A method as defined in claim 3, wherein the step of providing an electronically controlled switch includes providing a MOSFET.

6. A method as defined in claim 3, wherein the step of controlling the first switch includes sending a trigger signal to a gate of the SCR and thereupon removing the trigger signal from the gate after the SCR becomes conductive.

7. A method as defined in claim 6, wherein the step of sending a trigger signal includes the step of activating a triac to pass the trigger signal to the gate of the SCR and thereafter deactivating the triac to remove the trigger signal from the gate of the SCR.

8. A method as defined in claim 3, further comprising the step of completing a predetermined number of cycles of the AC voltage signal upon start-up prior to performing the steps of conducting current through the first and second loops.

9. A method as defined in claim 2, further comprising the step of monitoring a temperature of the SCR, and thereupon discontinuing the conduction of current through the SCR when a temperature of the SCR exceeds a predetermined maximum value.

10. A method as defined in claim 9, further comprising resuming controlled conduction of current through the SCR when a temperature of the SCR falls below the predetermined maximum value.

11. A method as defined in claim 1, further comprising the step of regulating a voltage of the ringing current pulse.

12. A method as defined in claim 11, wherein the step of regulating includes adjusting the voltage of the ringing current pulse so as to lie between a predetermined minimum value and a predetermined maximum value.

13. A method as defined in claim 12, wherein the step of regulating further includes measuring AC voltage across the coil means upon start-up, and using the AC voltage upon start-up as an offset.

14. A system for electromagnetically treating a flowing liquid, said system comprising:
    a coil means surrounding the flow of liquid;
    an AC power source;
    a switching arrangement connected in series with the coil means and the AC power source, the switching arrangement including first and second switch means connected in parallel with one another; and
    a control means for controlling the operation of the first and second switch means;
    wherein current is conducted through said first switch means during at least a portion of a first half cycle while current is prevented from being conducted through said second switch means; and
    wherein current is conducted through said second switch means during a first portion of a second half cycle while current is prevented from being conducted through said first switch means.

15. A system as described in claim 14, wherein the control means includes a programmed digital micro-controller.

16. A system for electromagnetically treating a flow of liquid, said system comprising:

a coil means surrounding the flow of liquid and having both an inductance and a capacitance in parallel with one another;

a switch means connected in series with the coil means to form a series connected combination;

an AC power source connected across the series connected combination; and said switch means being operable to close a circuit through the AC power source and the coil means during a first portion of each cycle of the AC power source, during which first cycle portion current from the AC power source flows in one direction through the coil means, and the switch means also being operable during a remaining portion of each cycle of its AC power source to first open and then close the circuit a multiple number of times to create an equal multiple number of ringing pulses of current in the coil means; and wherein said switch means conducts current from the AC power source in one direction through at least a portion of said switch means and the coil means during at least a portion of each first half-cycle of the AC power source and does not conduct current through at least a portion of said switch means in a direction opposite to said one direction during each second half cycle of the AC power source.

17. A system as defined in claim 16, wherein the switch means comprises a MOSFET and an SCR.

18. A system for electromagnetically treating a flow of liquid, said system comprising:

a coil means surrounding the flow and having both an inductance and a capacitance;

means providing a source of AC voltage having a period including a first half-cycle of one polarity and a second half-cycle of a polarity opposite to that of the first half-cycle;

a first switch in series with the AC voltage source and the coil means;

means controlling the first switch so as to conduct current from the AC voltage source in one direction through the first switch and the coil means during at least a portion of each first half-cycle of the AC voltage source and so as to not conduct current through the first switch in a direction opposite to said one direction during each second half-cycle of the AC voltage source; and means operable and at least once during each second half-cycle of the AC voltage source for connecting a source of electrical energy to the coil means to add electrical energy to the coil means and for then disconnecting the source of electrical energy from the coil means to produce a ringing current pulse in the coil means.

19. A system as defined in claim 18, wherein:

said first switch is a silicon controlled rectifier (SCR) forming a first electrical loop with the coil means and the AC voltage source.

20. A system as defined in claim 19, wherein:

an electronically controlled second switch is connected in series with the coil means and the AC voltage source to form a second electrical loop; and further includes means for controlling said second switch so at least once during each second half-cycle of the AC power source said second switch is first closed to connect the AC voltage source to the coil means to add electrical energy to the coil means and then opened to produce a ringing current pulse in the coil means.

21. A system as defined in claim 20, wherein the second switch is electrically connected in parallel with the SCR.

22. A system as defined in claim 21, and further comprising:

a microcontroller controlling at least in part the operation of said first and second switches.

23. A system as defined in claim 20, further including means for sending a trigger signal to a gate of the SCR during at least a portion of the first half-cycle when the SCR is forward biased and for thereupon removing the trigger signal from the gate after the SCR becomes conductive.

24. A system as defined in claim 23, wherein the means for sending a trigger signal includes a triac that when activated passes the trigger signal to the gate of the SCR and that when deactivated removes the trigger signal from the gate of the SCR.

25. A system as defined in claim 19, further comprising means for monitoring a temperature of the SCR and thereupon halting a conduction of current therethrough when a temperature of the SCR exceeds a predetermined maximum value.

26. A system as defined in claim 18, further comprising means for regulating a voltage of the ringing current pulse.

27. A system as defined in claim 26, wherein the regulating means includes means for adjusting the voltage of the ringing current pulse to lie between a predetermined minimum value and a predetermined maximum value.

* * * * *